United States Patent [19]
Saitoh

[11] Patent Number: 5,872,792
[45] Date of Patent: Feb. 16, 1999

[54] MICROCOMPUTER

[75] Inventor: Hiroshi Saitoh, Tokyo, Japan

[73] Assignee: Oki Electric Industry Co., Ltd., Tokyo, Japan

[21] Appl. No.: 878,485

[22] Filed: Jun. 18, 1997

[30] Foreign Application Priority Data

Sep. 13, 1996 [JP] Japan .................................. 8-242971

[51] Int. Cl.$^6$ .................................................. G06F 11/00
[52] U.S. Cl. ............................................................ 371/21.2
[58] Field of Search ................................. 371/21.2, 21.3, 371/21.4, 21.6, 21.1; 395/182.03, 381, 825

[56] References Cited

U.S. PATENT DOCUMENTS 5,617,429 4/1997 Goto ........................................... 371/25
5,632,024 5/1997 Yajima et al. ............................ 395/381

FOREIGN PATENT DOCUMENTS 1-154248 6/1989 Japan .

*Primary Examiner*—Vincent P. Canney
*Attorney, Agent, or Firm*—Venable Robert J. Frank

[57] ABSTRACT

An object of the present invention is to provide a microcomputer capable of checking the data stored in a read only memory (ROM) integrally formed therein even without using any additional testing device, but an external ROM. In the test mode, a test signal TS to be fed to an external terminal 15 is set to a logic "1". By this operation, the output signal of a register 13 is fed to the address terminal A of the internal ROM 16 by way of a selector 14. Further, the data read out from the ROM 16 is outputted to a register 18 through a selector 17. On the other hand, by connecting the external ROM 30, in which a test program is stored, to an address terminal 21 and a data terminal 22. The CPU 11 can carry out the test program stored in the external ROM 30. By reading and comparing the data stored in the ROM 16 and the data stored in the external ROM 30 to be compared by the test program, the data in the ROM 16 can be checked.

7 Claims, 4 Drawing Sheets

F I G. 3
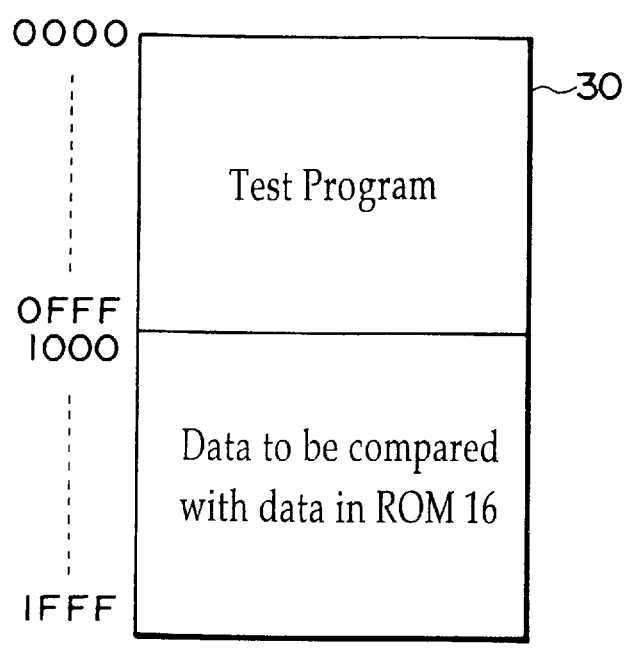

MICROCOMPUTER

BACKGROUND OF THE INVENTION

1. Field of the Invention

The present invention relates to a microcomputer formed by integrating a central processing unit (hereinafter referred to as a CPU), a read only memory (hereinafter referred to as a ROM), and the like on a semiconductor substrate, and more particularly, to a microcomputer with a function for checking the contents stored in the ROM.

2. Description of the Related Art

Conventionally, there has been provided such a microcomputer as disclosed in Japanese Patent Application Laid-Open No. 1-154248.

FIG. 2 shows a general schematic view of a conventional microcomputer disclosed in the above document. The microcomputer in the figure comprises a CPU 1, to which an address bus 2 and a data bus 3 are connected, for transmitting address signals and data signals respectively. To the address bus 2, an address terminal of a ROM 4 is connected. The ROM 4 is a memory means that contains a predetermined data storing area wherein the data stored in an area designated by an address signal fed to the address terminal is read out. To the output side of the ROM 4, an input side of an output selection circuit 5 is connected. The output selection circuit 5 comprises a selection terminal S and a pair of output terminals O0, O1. The output selection circuit S selects either one of these output terminals in accordance with a logic "0" or "1" of a test signal TS fed to the selection terminal S by way of an external terminal 6, and outputs the signal inputted through the input side of the circuit.

The output terminals O0 and O1 of the selection circuit 5 are connected to the input terminal I0 and an external terminal 8 respectively. The input selection circuit 7 comprises input terminals I0 and I1, and also a selection terminal S. The input selection circuit 7 selects either one of signals inputted to these input terminals in accordance with a logic "0" or "1" of the test signal TS fed to the selection terminal S by way of an external terminal 6, and outputs the thus selected signal to the output side of the circuit. The input terminal I1 of the selection circuit 7 is connected to an external terminal 9, and the output side of the circuit 7 is connected to the data bus 3. Further, connected to the address bus 2 is an external terminal 10 for outputting address signals externally.

In the microcomputer structure as described above, as a normal operation mode is designated in its normal operation, the test signal TS to be fed to the external terminal 6 is set to "0". In this way, the signal fed to the output selection circuit 5 from the ROM 4 is outputted through the output terminal O0 side, so that the signal fed to the input terminal I0 of the input selection circuit 7 is selected to be outputted. In this way, the data in the ROM 4 is finally outputted to the data bus 3, and a digital process is executed by the CPU 1 on the basis of the program stored in the ROM 4.

On the other hand, in a test mode in which the content stored in the ROM 4 is to be tested, a data terminal and an address terminal of an external ROM (not shown) in which a test program is stored are connected to the external terminals 9 and 10 respectively, and a testing device for data reading is connected to the external terminal 8.

Further, the test signal TS to be fed to the external terminal 6 is set to "1". In this way, the signal fed to the input selection circuit 5 from the ROM 4 is outputted through the output terminal O1 side, so that the signal fed to the input terminal I1 of the input selection circuit 7 is selected to be outputted. Subsequently, the data stored in the external ROM is outputted to the data bus 3, and the data in the ROM 4 is outputted externally by way of the external terminal 8. The CPU 1 then executes a procedure in accordance with a test program stored in the external ROM. The address signal AD outputted to the address bus 2 is successively updated in accordance with the processing operation of the CPU 1. In accordance with the thus updated address signal AD, the data stored in the corresponding address in the ROM 4 is outputted to the external terminal 8, whereby the testing device connected to the external terminal 8 reads the thus outputted data and checks the content of the data stored in the ROM 4.

However, there have been the following two drawbacks in the test for checking the contents stored in the ROM 4 conducted by the conventional microcomputer.

(i) An external testing device is required to read the data stored in the ROM 4 outputted from the external terminal 8.

(ii) Due to the fact that the address signals AD are fed from the address bus 2 to the address terminal of the ROM 4 on the basis of the test program stored in the external ROM, it is not an easy task and is in fact almost impossible to read all of the addresses one by one, so that making a complete test program for conducting a perfect test is rather difficult.

SUMMARY OF THE INVENTION

In view of the aforementioned, a microcomputer of the present invention is formed by integrating a plurality of basic elements mounted on a semiconductor substrate, wherein the elements are: a central processing unit for outputting address signals, and for performing digital processing including data comparison and computing operations on the basis of a first data signal which is fed in accordance with the address signals, and for outputting a second data signal on the basis of the digital processing operation; a common bus formed by a data signal bus for transmitting one of the first and second data signals and an address signal bus for transmitting the address signals; a first holding means connected to the common bus for holding the second data signal when the first holding means is designated by the address signal, and outputting the held data; a selecting means to which the address signal and a signal outputted from the first holding means are fed, and in a test mode, a signal from the first holding means is selected to be outputted, and in a non-test mode, the address signal is selected to be outputted; and a read only memory having a data storing area for reading out the data stored in an area designated by an output signal from the selecting means;

The microcomputer configured as above further comprises a switching means having an input side for receiving a signal outputted from the read only memory and first and second output sides, and in the test mode, an inputted signal is sent to the first output side, and in the non-test mode, the inputted signal is sent to the second output side as the first data signal to the common bus; a second holding means connected to the first output side of the switching means for holding an outputted signal from the switching means, and outputting the data held in the second holding means when the second holding means is designated by the address signal to the common bus as the first data signal; an address terminal for outputting the address signals externally; and a data terminal to which the first data signal is inputted from an external side of the microcomputer.

In the non-test mode, the address signal fed from the CPU is selected by the selecting means and fed to the ROM. The data stored in the region of the ROM designated by the address signal is read out as the first data signal, and is outputted from the second output side of the switching means to the common bus. In this way, a digital processing operation is conducted on the basis of the program stored in the ROM.

In the test mode, the data stored in the first holding means is fed to the ROM by way of the selecting means. The data stored in the ROM is fed to the second holding means by way of the switching means. In this way, the CPU is prevented from directly accessing the ROM. On the other hand, since the address signal is outputted externally by way of the address terminal and the first data signal is inputted from the external side by way of the data terminal, the CPU can execute a program stored in an external ROM if the external ROM is connected to these terminals. Thus, by connecting an external ROM containing a test program therein for reading out the contents of the internal ROM through the first and second holding means, the contents of the ROM can be efficiently checked.

BRIEF DESCRIPTION OF THE DRAWINGS

FIG. 3 is a memory map of an external ROM used for the checking test, which external ROM is to be connected to the microcomputer of FIG. 1.

DESCRIPTION OF THE PREFERRED EMBODIMENTS

Figure 1:
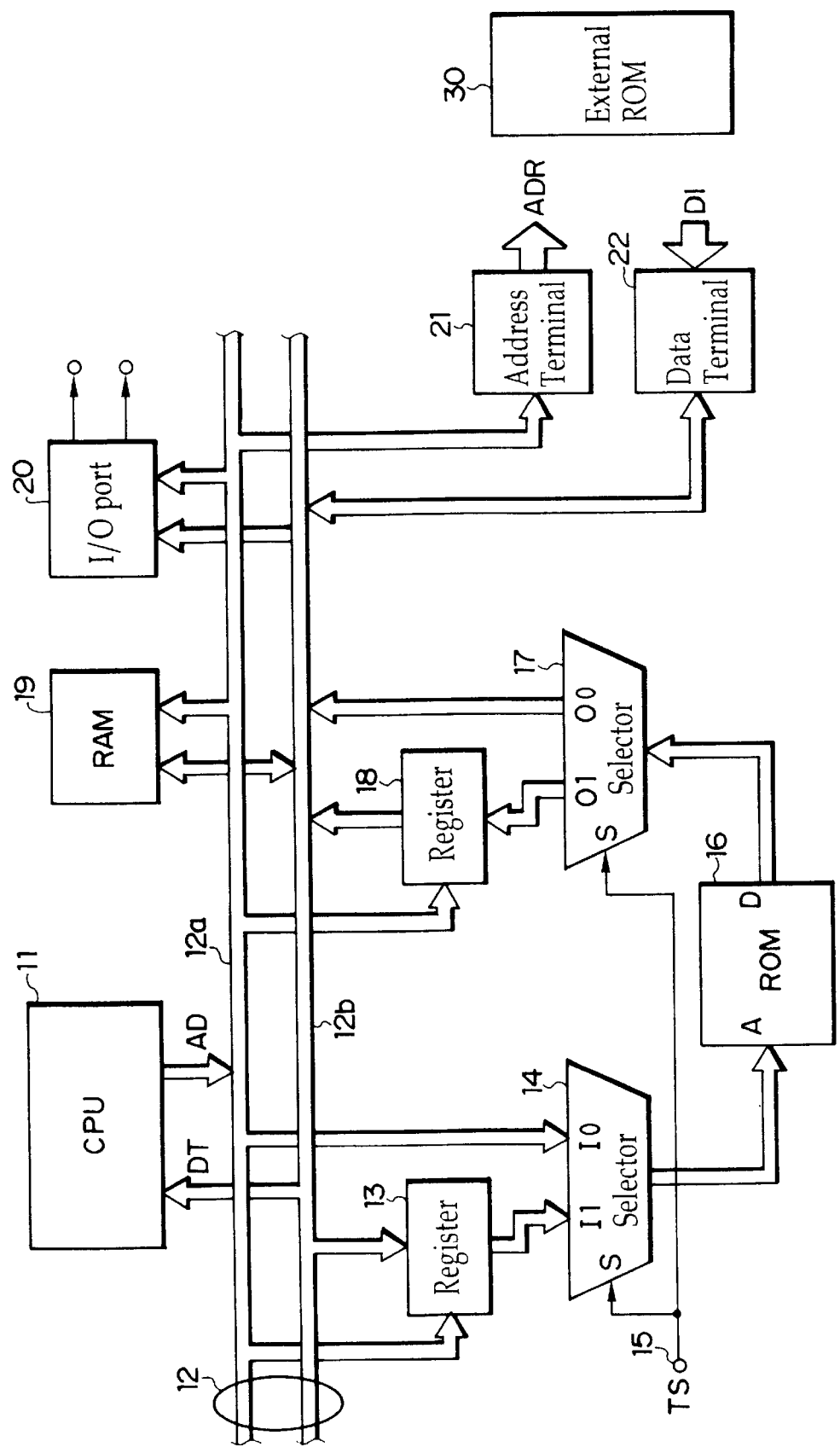
FIG. 1 is a general schematic view of a microcomputer showing an embodiment of the present invention.
Figure 2:
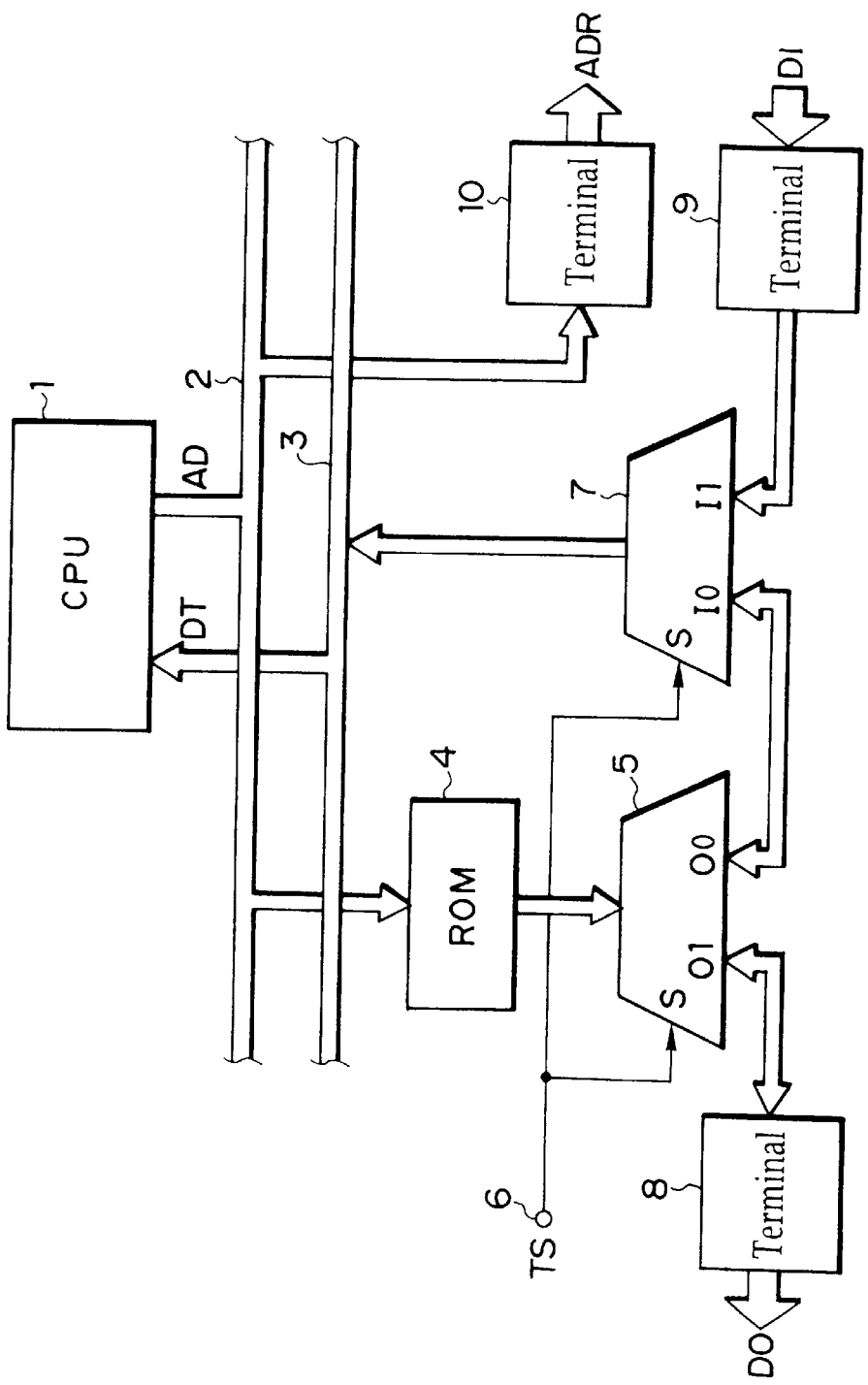
FIG. 2 is a general schematic view of a conventional microcomputer.

A general schematic view of a microcomputer according to an embodiment of the present invention is shown in FIG. 1.

This microcomputer is mounted on a semiconductor substrate having a CPU 11 as a logic center thereof. The CPU 11 comprises a system control section (not shown), a computing section, an arithmetic control section and a common bus control section. The CPU 11 outputs address signals AD, executes a digital process such as data comparison and calculation on the basis of the data signals DT which are fed in accordance with the address signals AD, and outputs the result of the thus executed digital processing as a data signal DT.

A common bus 12, which contains an address bus 12a and a data bus 12b transmitting address signals AD and data signals DT respectively, is connected to the CPU. A first holding means (for example a register) 13 is connected to the common bus 12. The register 13 has an address assigned thereto, and holds the data signal DT on the data bus 12b when it is designated by the address data AD, and outputs the data thus held. The output side of the register 13 is connected to an input terminal I1 of the two input terminals I0 and I1 of a selection means (for example a selector) 14. The other input terminal I0 is connected to the address bus 12a. The selector 14 contains also a selection terminal S, and selects either one of signals inputted to these input terminals I0 and I1 in accordance with a logic "0" or "1" of the test signal TS fed to the selection terminal S by way of an external terminal 15, and outputs the thus selected signal. The output side of the selector 14 is connected to the address terminal A of the ROM 16.

The ROM 16 is a memory means which contains a predetermined data storing area (for example from the addresses 0H through 0FFFH, wherein H indicates a hexadecimal symbol), and reads data stored in the address therein designated by the signal fed to the data terminal A, and sends it to the data terminal D. The output side of the ROM 16 is connected to the input side of a selection means (for example a selector) 17. The selector 17 comprises a selection terminal S and two output terminals O0 and O1. The selector 17 receives the data fed thereto through the input side thereof, and sends the signal to the output terminal O0 when the signal fed to the selection terminal S is a logic "0", and sends the signal to the output terminal O1 when the signal fed to the selection terminal S is a logic "1". The selection terminal S and the output terminals O0 and O1 of the selector 17 are connected respectively to the external terminal 15, the data bus 12b and the input side of a second holding means (such as a register) 18.

The register 18 is connected to the common bus 12, holds the signal fed to the input side thereof, and outputs the thus held signal to the data bus 12b as a data signal DT when an address assigned to the register 18 is designated by the address signal AD.

The common bus 12 is further connected to a random access memory (hereinafter referred to as a RAM) 19 for temporarily storing data, and also to an I/O port 20 which functions as an input-output interface of parallel data with external devices. Further, an address terminal 21 for outputting address signals AD to an external device is connected to the address bus 12a. A data terminal 22 for inputting the data signals DT from the external device is connected to the data bus 12b. These address terminal 21 and data terminal 22 are, when in the test mode, connected to an external ROM 30 which is used specially for the testing operation.

FIG. 3 shows a memory map of the external ROM 30 which is connected to the address terminal 21 and the data terminal 22 in the testing mode. In the addresses 0H through 0FFFH of the ROM 30, a testing program is stored for checking the contents of the ROM 16. In the addresses 1000H through 1FFFH, data identical to the data stored in the addresses 0H through 0FFFH of the ROM 16 is stored.

The operation of the microcomputer structured as described above will now be explained for individual cases of (I) the normal operation mode, and (II) the test mode.

(I) Operation in the normal operation mode

In the normal operation mode, a test signal TS to be fed to the external terminal 15 is set to "0". In this way, in the selector 14, the input terminal I0 side is selected, and subsequently the address signal AD on the address bus 12a is inputted to the address terminal A of the ROM 16. Further, in the selector 17, the output terminal O0 side is selected, and subsequently the data signal DT outputted from the data terminal D of the ROM 16 is outputted to the data bus 12b.

Here, if a reset signal (not shown) is fed to the CPU 11, The CPU 11 outputs an address signal AD having a value of 0H to the address bus 12a, and a command of the processing program stored in the address 0H of the ROM 16 is outputted to the data bus 12b. When the CPU 11 executes this command, the commands of the processing program in the ROM 16 are successively read and executed one by one, so that digital processing based on this processing program is executed.

(II) Operation in the test mode

Figure 4:
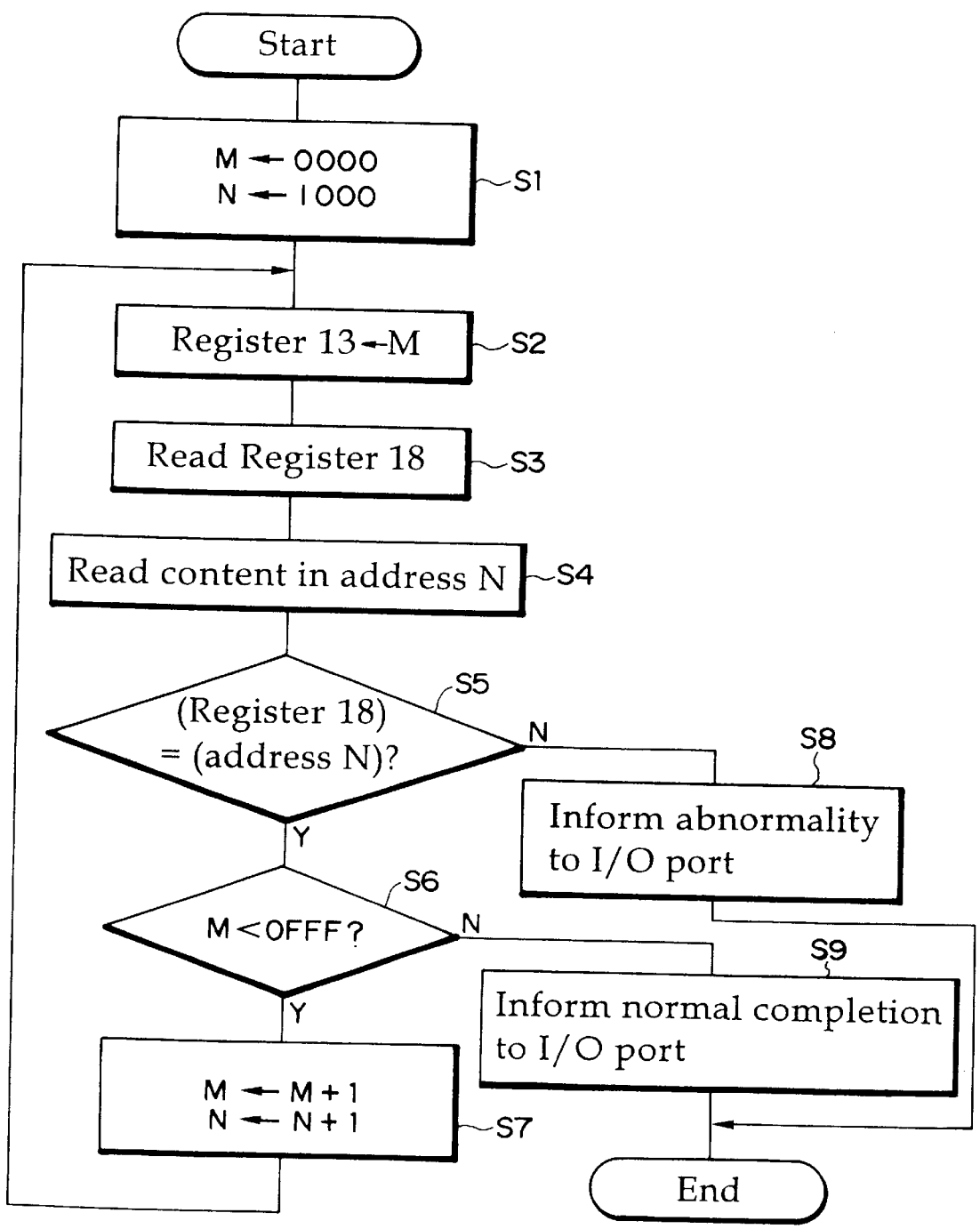
FIG. 4 is a flowchart explaining a procedure of the test program stored in the external ROM.

FIG. 4 is a flowchart showing the processes of the testing program stored in the external ROM 30 of FIG. 3.

In the following description, the procedure for checking the contents of the ROM 16 in FIG. 1 is explained with reference to FIG. 4.

Before executing the test program, the test signal TS to be fed to the external terminal 15 is set to "1". In this way, the input terminal I1 is selected at the selector 14, and the data signal DT on the data bus 12b is inputted to the address terminal A of the ROM 16 by way of the register 13. Further, at the selector 17, the output terminal O1 is selected, and the data signal DT outputted from the data terminal D of the ROM 16 is outputted to the data bus 12b by way of the register 18.

Thereafter, the ROM 30 for executing the test, in which ROM 30 data shown in FIG. 3 are stored, is connected to the address terminal 21 and the data terminal 22.

Next, by supplying a reset signal (not shown) to the CPU 11, an address signal AD having 0H is outputted to the address bus 12a. The address signal AD is fed to the external ROM 30 by way of the address bus 12a and the address terminal 21. In this way, the command of the testing program stored in the address 0H of the external ROM 30 is outputted to the data bus 12b. When this command is executed by the CPU 11, the commands in the external ROM 30 are successively read out, so as to execute the following process as shown in FIG. 4.

In step S1 of FIG. 4, variables M and N provided in the RAM 19 are substituted by the initial values 0H and 1000H respectively, and the procedure moves on to step S2.

In step S2, the variable M (in this case 0H) is written into the register 13, and the procedure moves on to step S3.

In step S3, the contents of the register 18 are read out, and the procedure moves on to step S4. At this stage, since the value in the register 13 is 0H, the contents of the address 0H of the ROM 16 have been written into the register 18, so that the contents read from the register 18 are the data in the address 0H of the ROM 16.

In step S4, the contents in the address N (in this case 1000H) are read out, and the procedure moves on to step S5. The address 1000H is in the external ROM 30, and in this address, the data in the address 0H of the ROM 16 is stored as the data for comparison.

In step S5, the contents of the register 18 and the contents of the address N are compared. This means a comparison between the contents of the address of the ROM 16 and the contents of the address 1000H of the external ROM. If the contents of the ROM 16 are correct, the comparison in step S5 results in the respective contents being equal to each other, and the procedure moves on to step S6. If the comparison in step S5 does not result in the respective contents being equal to each other, then the procedure moves on to step S8 to inform the I/O port 20 that there is an abnormal state, and the procedure ends.

In step S6, it is judged whether the value of the variable M is below FFFH. If the value is below FFFH, then the procedure moves on to step S7. If the value is greater than or equal to FFFH, then the procedure moves on to step S9, and informs the I/O port 20 that there is a normal state and that the test has been completed, and the procedure ends here.

In step S7, the value of each variable M and N is incremented by one respectively, and the procedure returns to step S2, In this way, the contents in each of the addresses between 0H and FFFH of the ROM 16 and those between 1000H and 1FFFH of the external ROM 30 are compared, varying the variables M and N one by one successively. By this operation, if there occurs a mismatch of the respective contents of corresponding addresses, notice is given of an abnormal state in step S8, On the other hand, when all of the contents of the corresponding addresses coincide, then the procedure moves on to step S9, and notice is given that that the program has completed and that there are no abnormalities.

As described hereinabove, since the microcomputer of the present embodiment includes selectors 14, 17 for switching the connection of the ROM 16 in accordance with a test signal TS, in the test mode, the test program stored in the external ROM 30 can be executed by connecting the external ROM 30 to the address terminal 21 and the data terminal 22. By this operation, the content in the ROM 16 can be thoroughly checked, even without using any additional testing device.

The present invention is not limited to the above embodiment, various modifications can be realized. Example of such modifications are as follows.

(a) Although the address in the ROM 16 is set from 0H to 1FFFH, any kind of ROM 16 can be adopted, regardless of its capacity.

(b) In the external ROM 30, there is stored a test program for checking the contents of the ROM 16. However, what is to be checked is not limited to the contents of the ROM 16. A test program for testing various functions of the I/O port 20 or the like can be used as well. In this way, a test of the entire microcomputer including the ROM 16 can be efficiently conducted.

(c) In FIG. 1, although there are provided an address terminal 21 and a data terminal 22 only for connection to the external ROM 30 instead, an I/O external terminal which is not used during the test mode can be used in common by use of a selector for switching a test signal TS, which avoids a terminal neck phenomenon.

(d) Although in the test mode, the address terminal 21 and the data terminal 22 are connected to the external ROM 30 to execute the test, what should be connected to these terminals is not limited to this external ROM 30, and another computer can be connected instead. In this way, a more precise test can be conducted.

As explained above, since there are a selection means and a switching means for switching the connection of input/output of the ROM in the present invention, in the test mode, the ROM is cut off from the common bus and is connected to a first and a second holding means. Further, since there are provided an address terminal and a data terminal, the checking test can be readily conducted merely by connecting an external ROM containing the testing program to these terminals. In this way, a microcomputer test including a test for checking the contents of the ROM can be readily conducted even without using any additional testing device.

What is claimed is:

1. A microcomputer formed by integrating a plurality of elements mounted on a semiconductor substrate, said elements being:

a central processing unit for outputting address signals, and for performing digital processing including data comparison and computing operations on the basis of a first data signal which is fed in accordance with said address signals, and for outputting a second data signal on the basis of said digital processing operation;

a common bus formed by a data signal bus for transmitting one of said first and second data signals and an address signal bus for transmitting said address signals;

a first holding means connected to said common bus for holding said second data signal when the first holding means is designated by said address signal, and outputting said held data;

a selecting means to which said address signal and a signal outputted from said first holding means are fed, and in a test mode, a signal from said first holding means is selected to be outputted, and in a non-test mode, said address signal is selected to be outputted;

a read only memory having a data storing area for reading out the data stored in an area designated by an output signal from said selecting means;

a switching means having an input side for receiving a signal outputted from said read only memory and first and second output sides, and in said test mode, an inputted signal is sent to said first output side, and in said non-test mode, said inputted signal is sent to said second output side as said first data signal to said common bus;

a second holding means connected to said first output side of said switching means for holding an outputted signal from said switching means, and outputting the data held in said second holding means when said second holding means is designated by the address signal to said common bus as said first data signal;

an address terminal for outputting said address signals externally; and a data terminal to which said first data signal is inputted from an external side of said microcomputer.

2. A microcomputer as claimed in claim 1, wherein said address terminal and said data terminal are connected to an external read only memory, said external memory containing a test program and data identical to the data of said read only memory integrated in said microcomputer.

3. An microcomputer as claimed in claim 2, wherein said first signal data is a program stored in said read only memory and said external read only memory, and said second signal data is data generated during said digital processing operation.

4. A microcomputer as claimed in claim 1, wherein selection at said selecting means and said switching means is carried out in accordance with a logic "0" or "1" fed thereto as a test signal.

5. A microcomputer formed by integrating a plurality of elements mounted on a semiconductor substrate, said elements being:

a central processing unit for outputting address signals, and for performing digital processing including data comparison and computing operations on the basis of a first data signal which is fed in accordance with said address signals, and for outputting a second data signal on the basis of said digital processing operation;

a common bus formed by a data signal bus for transmitting one of said first and second data signals and an address signal bus for transmitting said address signals;

a random access memory provided for said digital processing operation;

a first holding means connected to said common bus for holding said second data signal when the first holding means is designated by said address signal, and outputting said held data;

a selecting means to which said address signal and a signal outputted from said first holding means are fed, and in a test mode, a signal from said first holding means is selected to be outputted, and in a non-test mode, said address signal is selected to be outputted;

a read only memory having a data storing area for reading out the data stored in an area designated by an output signal from said selecting means;

a switching means having an input side for receiving a signal outputted from said read only memory and first and second output sides, and in said test mode, an inputted signal is sent to said first output side, and in said non-test mode, said inputted signal is sent to said second output side as said first data signal to said common bus;

a second holding means connected to said first output side of said switching means for holding an outputted signal from said switching means, and outputting the data held in said second holding means when said second holding means is designated by the address signal to said common bus as said first data signal;

an address terminal for outputting said address signals to an external memory containing a test program and a data identical to the data of said read only memory; and a data terminal to which said first data signal is inputted from said external memory, wherein, said test program is arranged to set in said random access memory an address in which the data of said read only memory starts and an address in which the data identical to that of said read only memory starts within said external memory, and compare all the data one by one consecutively.

6. An microcomputer as claimed in claim 5, wherein said first signal data is a program stored in said read only memory and said external read only memory, and said second signal data is data generated during said digital processing operation.

7. Microcomputer as claimed in claim 5, wherein selection at said selecting means and said switching means is carried out in accordance with a logic "0" or "1" fed thereto as a test signal.

* * * * *